United States Patent [19]
Huang

[11] Patent Number: 5,418,391
[45] Date of Patent: May 23, 1995

[54] SEMICONDUCTOR-ON-INSULATOR INTEGRATED CIRCUIT WITH SELECTIVELY THINNEDCHANNEL REGION

[75] Inventor: Tiao-Yuan Huang, Cupertino, Calif.

[73] Assignee: VLSI Technology, Inc., San Jose, Calif.

[21] Appl. No.: 222,139

[22] Filed: Mar. 31, 1994

[51] Int. Cl.⁶ .............................................. H01L 39/78
[52] U.S. Cl. .................................... 257/336; 257/344; 257/347; 257/348; 257/352; 257/353
[58] Field of Search ............... 257/347, 348, 352, 353, 257/336, 344

[56] References Cited

U.S. PATENT DOCUMENTS 5,124,768  6/1992  Mano et al. ........................ 257/347
5,246,870  9/1993  Merchant ........................... 257/347

OTHER PUBLICATIONS

"Double Snapback in SOI nMOSFET's and its Application for SOI ESD Protection," Koen Verhage, Guido Groeseneken, Jean-Pierre Colinge and Herman E. Maes, *IEEE Electron Device Letters*, vol. 14, No. 7, pp. 326-328 (Jul. 1993).
"MOSFET Drain Engineering for ESD Performance," Y. Wei, Y. Loh, C. Wang and C. Hu, *EOS/ESD Symposium* 92, 4.3.1-4.3.6. Jan. 1992.

*Primary Examiner*—Edward Wojciechowicz
*Attorney, Agent, or Firm*—Clifton L. Anderson

[57] ABSTRACT

A silicon-on-insulator transistor structure includes a selectively thinned channel region, leaving the source and drain regions relatively thick. The relatively thin channel region provides for full depletion, larger current handling, and thus, faster operation. The relatively thick source and drain regions provide resistance to damage by electrostatic discharge. The transistor structure can be formed from a silicon-on-insulator wafer by performing a light, deep source/drain implant; a shallow, heavy source/drain implant is optionally performed at this stage. Source and drain regions are masked, while the channel regions are etched to the desired channel thickness. After the mask material is removed, a gate oxide can be grown; gates can then be defined. If it has not been performed earlier, the shallow heavy source/drain implant can be performed at this point. In addition, a channel threshold adjust implant can be performed after the channel regions are thinned and before the gates are formed.

4 Claims, 5 Drawing Sheets

SEMICONDUCTOR-ON-INSULATOR INTEGRATED CIRCUIT WITH SELECTIVELY THINNEDCHANNEL REGION

BACKGROUND OF THE INVENTION

The present invention relates to integrated circuits and, more particularly, to semiconductor-on-insulator transistors. A major objective of the present invention is to provide improved silicon-on-insulator transistors that are capable of high-speed operation and resistant to damage by electrostatic discharge.

Much of modern progress is associated with the increasing circuit density and speeds of integrated circuits. One type of transistor, the insulated-gate field-effect transistor (IGFET) has provided for particularly favorable specifications for circuit density, performance, and power consumption and dissipation. IGFETs are more commonly known as MOS transistors. "MOS" stands for "metal oxide silicon"; however, in modern devices, the "metal" is doped polysilicon.

MOS transistors include a source, a drain, a channel, and a gate. The source and drain are semiconductor (typically silicon) regions doped so that they have a common conductivity type. An NMOS transistor has an n-type source and an n-type drain, while a PMOS transistor has a p-type source and a p-type drain. In an n-type semiconductor region, electrons are the majority charge carriers, while in a p-type semiconductor region, holes are the majority charge carriers. The source and drain are separated by a channel. Conduction between the source and drain is controlled by a field applied to the channel, which in turn results from a voltage applied to the gate. The gate is separated and insulated from the channel by an oxide insulator.

The conductivity type of channels of enhancement-mode MOS transistors is opposite that of the source and drain in the absence of a gate-to-source bias. Applying a suitable voltage to the gate creates an inversion layer in the channel. The inversion layer has the same conductivity type as the source and drain. Thus, the inversion layer conducts while the gate is applied and the inversion layer is in place. Such enhancement-mode MOS transistors are far more common than the alternative depletion-mode MOS transistors. In the absence of a gate-to-source voltage, the channel of a depletion-mode transistor has the same conductivity type as the source and drain so that it conducts. A suitable gate voltage depletes the channel of carriers, turning the transistor off.

One of the obstacles to greater circuit speeds is imposed by parasitic capacitances that afflict bulk silicon integrated circuits. In a conventional bulk silicon integrated circuit, transistor sources, drains, and channels are defined by doping regions of a silicon substrate. The boundaries of the source/drain regions with surrounding substrate silicon typically define diode junctions that have associated junction capacitances. The capacitances resist changes in gate voltages and transistor currents, thus impairing the switching speed of the transistors.

Silicon-on-insulator (SOI) technology provides for faster switching rates by eliminating non-functional junctions in the substrate. The silicon in which devices are defined is insulated from the substrate (which can be of silicon) by an insulating layer of, for example, silicon dioxide. Thus, source/drain active regions are bounded from below by insulator rather than by silicon of an opposite conductivity type. The insulator boundary does not produce parasitic capacitance so that faster transistor switching can occur.

When gate voltage changes are not significantly limited by parasitic capacitances, the sensitivity with which the channel responds to gate voltage changes can become a limiting factor. This sensitivity is maximized by making the silicon layer thin enough that substantially the entire depth of the channel region can be depleted by an appropriate gate voltage. Full depletion maximizes transistor switching speeds.

SOI circuits have thus been formed at high densities and with high operating speeds. Unfortunately, such circuits have been relatively vulnerable to electrostatic discharge. In particular, SOI transistors used for interfacing with external components can be exposed to electrostatic discharge; when so exposed, the transistors can be impaired or destroyed. While precautions can be used to limit such exposure, it would be highly desirable to make SOI transistors that can better withstand such exposure, yet maintain the high speed operation associated with SOI transistor circuits.

SUMMARY OF THE INVENTION

The present invention provides a semiconductor-on-insulator transistor structure with the semiconductor material at the source and drain regions being considerably thicker than the semiconductor material at the channel region. A gate of conductive material is insulated from the channel region by an insulating layer. The preferred materials are silicon for the substrate, silicon dioxide for the insulator, silicon as the semiconductor, silicon dioxide for the gate dielectric, and doped polysilicon for the gate material.

Preferably, the source and drain regions are at least twice as thick as the channel region. Each source and each drain can include a heavily doped section and a lightly doped section. To minimize a hot-carrier effect, only lightly doped sections need contact the channel regions. To this end, relatively shallow heavily doped sections can lie entirely above the channel region; in this "uniform" embodiment, the source/drain dopant profile can be uniform across the source/drain regions. In an alternative "laterally spaced" embodiment, the heavily doped sections can be laterally spaced from the channel regions; in this case, it is less critical that the heavily doped sections lie entirely above the channel regions. However, even with lateral spacing, having the heavily-doped sections shallow enough to be entirely above the channel region further reduces the hot-carrier effect.

The present invention provides that such a structure can be fabricated starting with a semiconductor-on-insulator structure. The semiconductor-on-insulator structure can be a pair of silicon dioxide on silicon wafers with their oxide layers thermally bonded to each other; either of the silicon layers can serve as the "semiconductor" in the following description of the inventive method.

The semiconductor is thinned to a desired thickness for the transistor source and drain regions. Preferably, a controlled chemical and mechanical etch is used to achieve the desired thickness. A source/drain implant can be performed at this time. In general, this involves a deep light source/drain implant that will serve as lightly doped sources and drains to minimize the hot-carrier effect. To fabricate the "uniform" embodiment of the invention, a shallow heavily doped source/drain implant can be performed at this step. To fabricate the "laterally spaced" embodiment, the heavy implant is deferred until after the gate has been defined.

The channel region is then etched to a desired channel thickness. To this end, the source/drain regions of the thinned semiconductor can be masked, while the channel regions are exposed. A conventional photoresist mask can be used for the required masking. A precisely controlled chemical etch is then applied to the channel regions, thinning them until the desired channel thickness is achieved. Preferably, the channel thickness is less than half the source/drain thickness. The mask material is then removed, and a gate oxide is grown. A gate is then defined, typically by depositing and photolithographically patterning polysilicon. A shallow heavy source/drain implant can be performed at this stage where the laterally spaced embodiment is desired. A channel threshold adjust implant can be performed at any point after the channel region is thinned and before the gate is defined.

The selectively thinned channel regions provide for high-speed operation, while the relatively thick source and drain regions provide resistance to damage by electrostatic discharge. The present invention limits any hot carrier effect by providing for lightly doped source and drain sections either vertically or both vertically and horizontally. These and other features and advantages of the present invention are apparent from the description below with reference to the following drawings.

In the figures, the sign of the slope of the hatching for silicon and polysilicon indicates conductivity type, while slope steepness roughly indicates dopant concentration.

DESCRIPTION OF THE PREFERRED EMBODIMENTS

Figure 1:
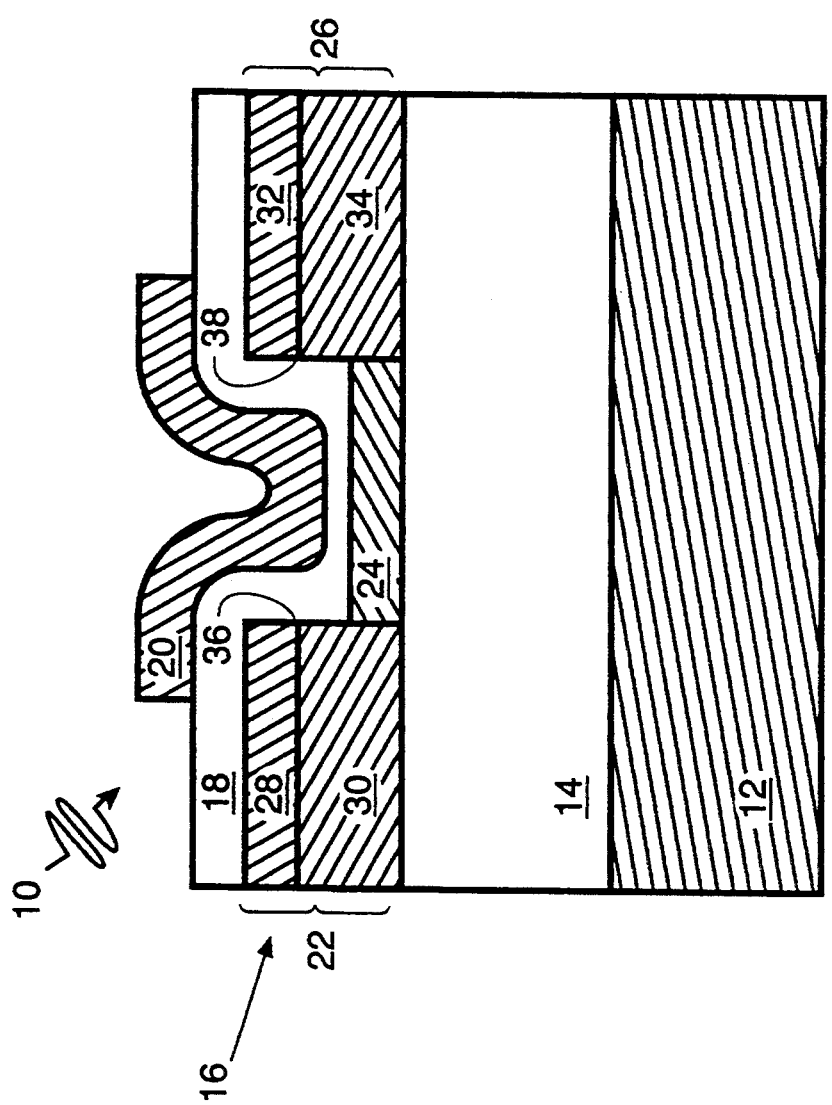
FIG. 1 is a schematic sectional view of an SOI transistor in accordance with the present invention.

An enhancement-mode NMOS SOI transistor 10 comprises a silicon substrate 12, a silicon dioxide insulator layer 14, a monocrystalline silicon layer 16, a gate oxide 18, and a gate 20, as shown in FIG. 1. Defined in silicon layer 16 are a source region 22, a channel region 24, and a drain region 26. Source region 22 includes a heavily doped source section 28 and a lightly doped source section 30. Drain region 26 includes a heavily doped drain section 32 and a lightly doped drain section 34.

Channel region 24 is thin enough to ensure full depletion when a suitable (e.g., 5 volts) voltage is applied to gate 20. Source region 22 and drain region 26 are more than twice as thick as channel region 24 to provide enhanced resistance to damage by electrostatic discharge.

Heavily doped source section 28 and lightly doped source section 30 are shown in FIG. 1 meeting at a source boundary 36, while heavily doped drain section 32 and lightly doped drain section 34 meet at a boundary 38. Source boundary 36 and drain boundary 38 extend laterally, indicating laterally uniform vertical dopant profiles. These boundaries 36 and 38 are at a level above channel region 24 so that lightly doped drain section 34 vertically separates heavily doped drain section 32 from channel region 24. Thus, lightly doped drain section 34 performs the conventional lightly doped drain function of reducing the hot-carrier effect. Lightly doped source section 30 serves the same role on the source side.

Figure 2A:
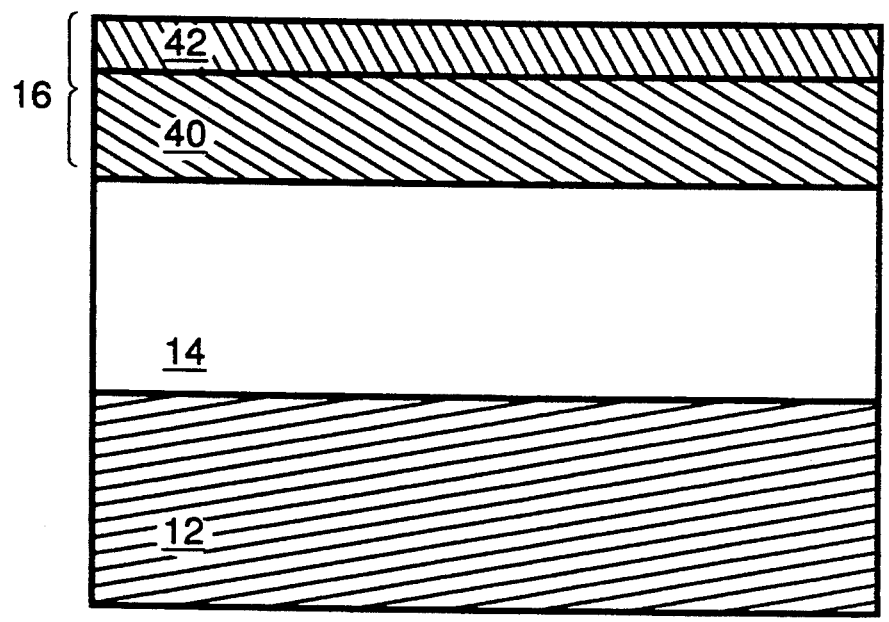
FIGS. 2A and 2B are schematic sectional views of the transistor of FIG. 1 at successive stages of its fabrication.
Figure 3:
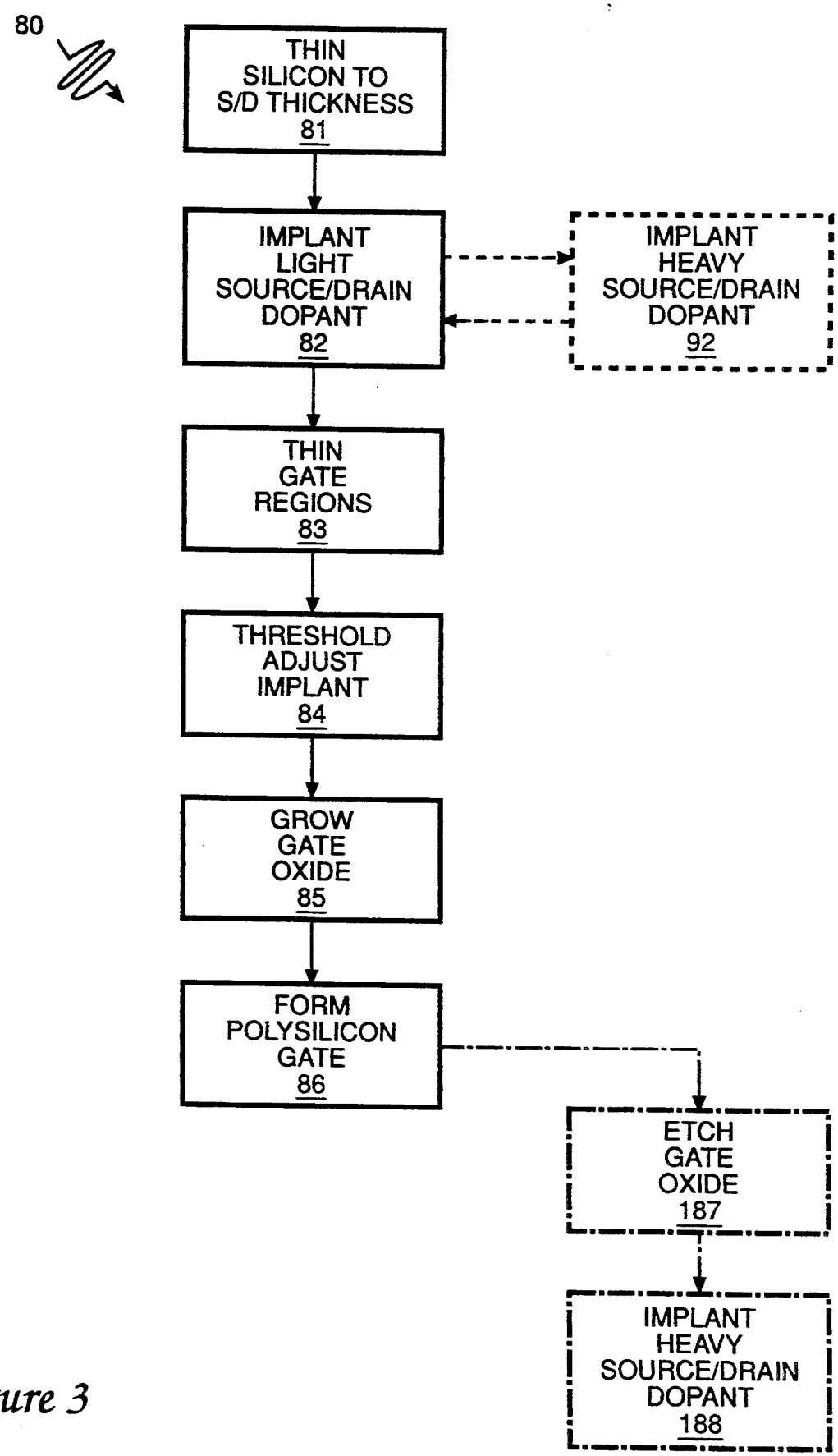
FIG. 3 is a flow chart of the method of the invention used to fabricate the transistor of FIG. 1.

FIG. 2A shows a precursor structure for transistor 10, which is fabricated by a method 80 flow charted in FIG. 3. The starting point for method 80 is a bonded SOI structure. Such structures, which are commercially available, are formed from a pair of wafers, each with a silicon substrate and a silicon dioxide layer formed thereon. The respective oxide layers are thermally bonded together, forming an Si/SiO2/Si sandwich, with both Si layers being monocrystalline.

At step 81, one of the silicon layers is thinned to the desired source/drain region thickness of about 300 nm. This can be done using a precisely monitored blanket chemical and mechanical etch. For example, Hughes Danbury Company teaches one such method.

Source/drain dopant is implanted at step 82 so that, after diffusion, the entire thickness of the silicon layer assumes the desired conductivity type for the sources and drains. To this end, phosphorus can be implanted with sufficient energy and in sufficient quantity so that upon drive-in, the bulk of silicon layer 16 has a concentration of $5 \times 10^{17}$ to $5 \times 10^{18}$ atoms/cm$^3$ of phosphorus. This moderate-concentration phosphorus implant provides for lightly doped n-type source and drain regions 30 and 34.

In the variation of method 80 used to form transistor 10, implant step 82 includes a substep 92 in which a blanket shallow, heavy source/drain implant is performed. Specifically, arsenic can be implanted to achieve a concentration of $5 \times 10^{19}$ atoms/cm$^3$ or higher with energy selected so that, after drive-in, the relatively low-mobility arsenic extends from the top of silicon layer 16 down about $\frac{1}{4}$ the depth of silicon layer 16. After substep 92, silicon layer 16 is divided into two sections, a relatively lightly doped section 40 and a relatively highly doped section 42, as indicated in FIG. 2A. In a second variation of method 80, the shallow heavy source/drain implant is deferred, as described further below.

Channel region 24 is selectively thinned at step 83. To this end, photoresist is deposited over the structure of FIG. 2A. The photoresist is exposed to patterned light and developed, leaving the photoresist mask 44 of FIG. 2B. Mask 44 covers source and drain regions 22 and 26, while channel region 24 is exposed. Exposed silicon channel region 24 is etched to a thickness of 100 nm. This means that the top of channel region 24 is 100 nm below the bottom level of heavily doped section 42, which is thus divided into heavily doped source section 28 and heavily doped drain sections 32.

The etching can be performed using a Hughes-Danbury process in which thickness is measured locally and chemical etching is performed locally in accordance with the measurement. The measurement and etching are repeated until the desired thickness is achieved.

Alternatively, an etching technique with high lateral resolution can be used to thin a channel region without a mask.

Figure 2B:
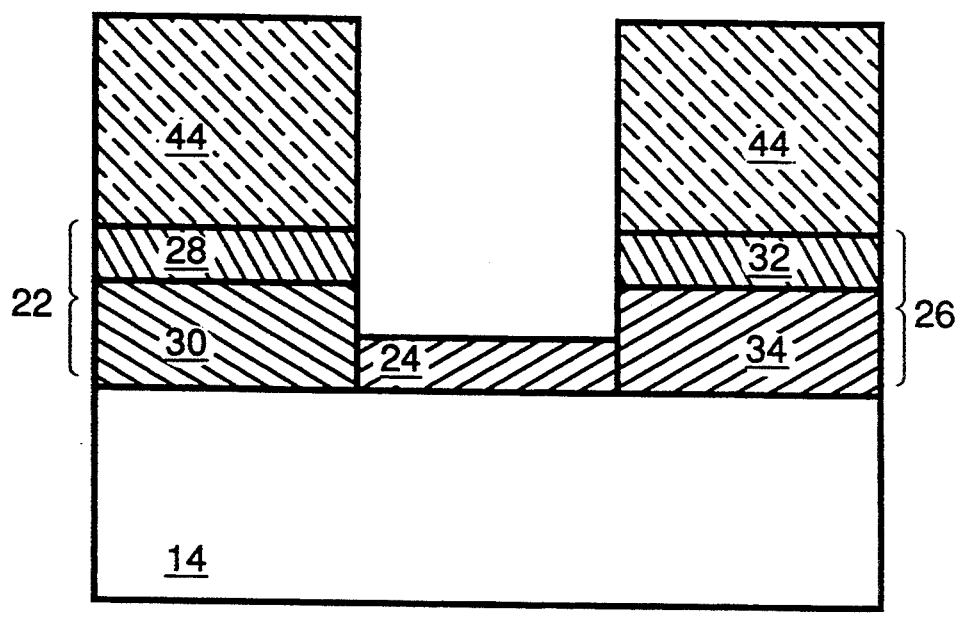

A threshold-adjust implant can be performed at step 84. To this end, boron can be implanted into channel region 24 with mask 44 still in place. To provide for enhancement-mode operation, sufficient boron is implanted to reverse the net conductivity type of the channel region to p-type, as indicated in FIG. 2B. After drive-in the concentration of boron should be from about $1 \times 10^{17}$ to about $2 \times 10^{17}$ atoms/cm$^3$. Alternatively, depletion mode operation can be provided for by limiting the implant concentration so that the conductivity type of channel region 24 is not reversed. P-type channel region 24 thus divides lightly doped section 42 to define lightly doped source section 30 and lightly doped drain section 34. The resulting structure is represented in FIG. 2B. Photoresist mask 44 can then be removed.

Method 80 also provides that the threshold-adjust implant can be performed without the mask. The threshold-adjust implant is relatively shallow so that, in the source/drain regions 16 and 26, it extends only into heavily doped source/drain sections 28 and 32. The heavy arsenic concentration in these sections completely dominates the much lighter boron implant. Thus, the threshold-adjust implant can be performed at any stage after channel thinning and before polysilicon gate 20 is formed. Thus, in a subvariation of the present invention, both the channel thinning and the threshold-adjust implant are performed without a source/drain mask.

Gate oxide 18 is grown at step 85. Gate 20 is formed at step 86. In particular, polysilicon is deposited over gate oxide 18. The polysilicon can then be heavily doped, e.g., n-type, to render it conductive. The resulting polysilicon layer is photolithographically patterned, completing transistor 10 as shown in FIG. 1.

Figure 4:
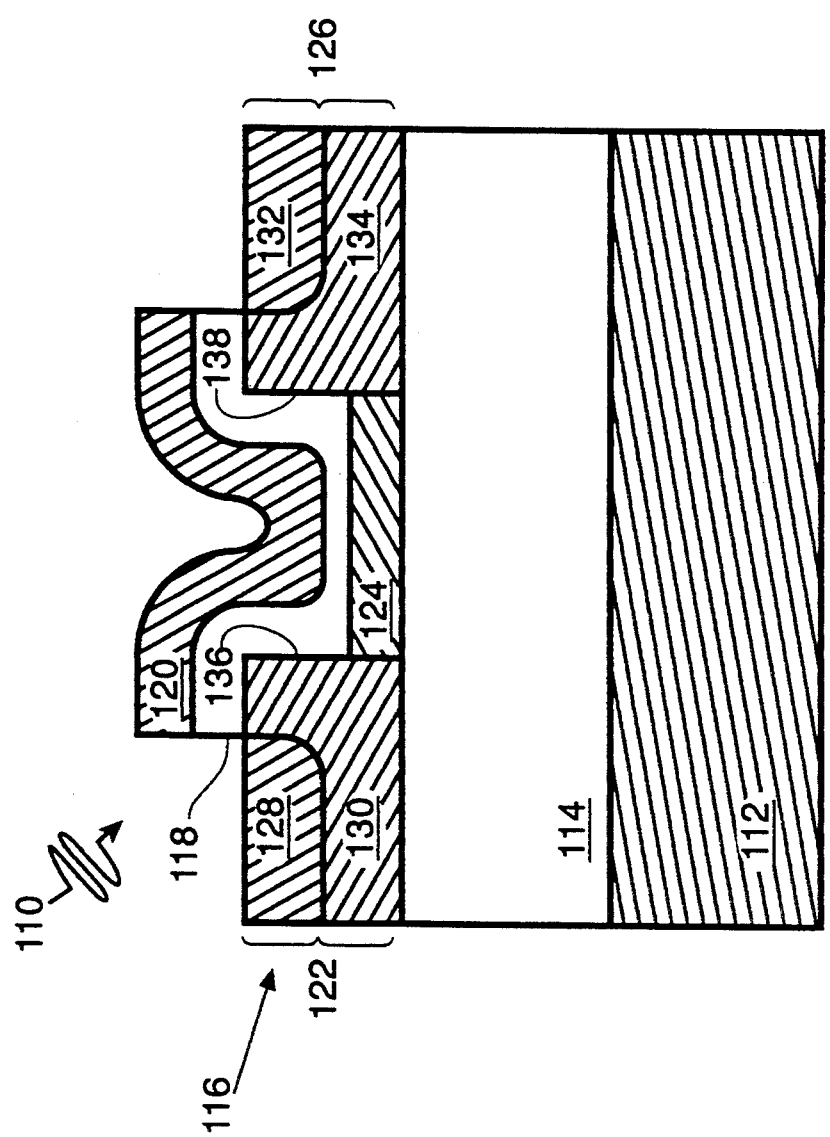
FIG. 4 is a schematic sectional view of another SOI transistor of the invention fabricated in accordance with the method of FIG. 3.

Method 80 provides for a transistor 110 in which lightly doped source/drain sections laterally separate a channel from heavily doped source/drain sections. Transistor 110 includes a substrate 112, an insulator layer 114, a silicon layer 116, a gate oxide 118, and a gate 120, as shown in FIG. 4. Silicon layer 116 includes a source region 122, a channel region 124, and a drain region 126. Source region 122 includes a heavily doped source section 128 and a lightly doped source section 130 meeting at a source boundary 136. Drain region 126 includes a heavily doped drain section 132 and a lightly doped drain section 134 meeting at a drain boundary 138.

Boundaries 136 and 138 do not extend all the way to the lateral position of channel region 124. Instead, they are laterally spaced from the position of channel region 124 approximately to the extent gate 120 overlaps source region 122 and drain region 126, respectively. Since the heavily doped sections 128 and 132 are spaced laterally from channel region 124, their depths are less critical to minimizing the hot carrier effect. Nevertheless, additional hot-carrier-effect reduction is achieved by having boundaries 136 and 138 above channel region 124.

Figure 5A:
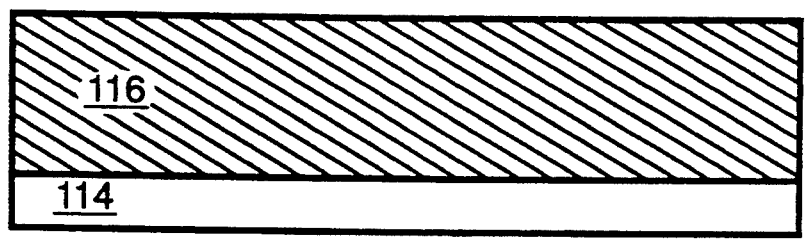
FIGS. 5A, 5B, and 5C are schematic sectional views of the transistor of FIG. 4 at successive stages of its fabrication.
Figure 5B:
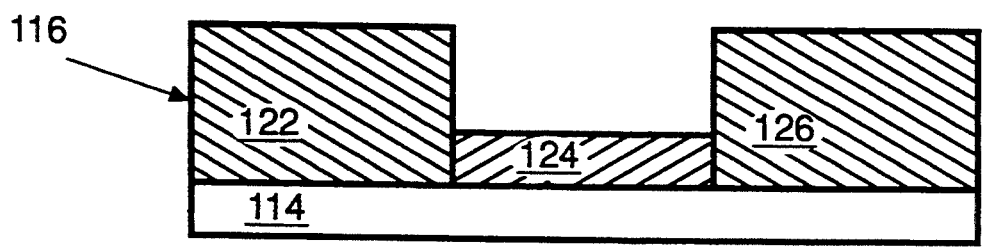
Figure 5C:
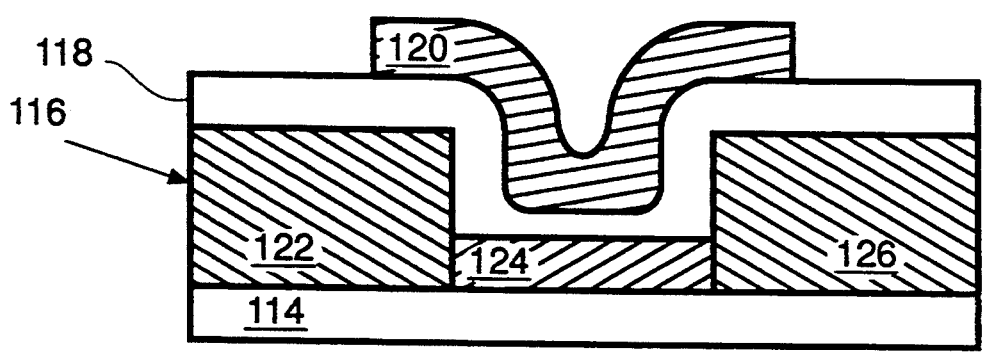

This "laterally spaced" variant of method 80 is co-represented in FIG. 3. Silicon is etched to source/drain thickness at step 81. The full thickness of resulting silicon layer 116 is then lightly doped n-type, resulting in the structure of FIG. 5A. (Substrate 112 is omitted from FIGS. 5A, 5B, and 5C.) The shallow heavy source/drain implant corresponding to substep 92 in the previously described variation of method 80 is postponed in this method variation.

Channel region 124 is selectively thinned at step 83. This is accomplished by photolithographically masking source and drain regions 122 and 126 and then etching the exposed silicon. Dopant is implanted at step 84 to render channel 124 p-type, resulting in the structure of FIG. 5B.

Gate oxide 118 is grown at step 85. Gate 120 is defined at step 86 by depositing and then photolithographically patterning polysilicon, resulting in the structure of FIG. 5C. At this stage the polysilicon is essentially undoped and thus not conductive.

Gate oxide 118 is etched at step 187 except where it is masked by gate 120, exposing some of source region 122 and some of drain region 126. A shallow heavy n-type implant at step 188 results in heavily doped source and drain regions 128 and 132 as illustrated in FIG. 4. This implant also causes gate 120 to become conductive.

While the present invention has been illustrated with respect to particular materials, steps, and dimensions, other semiconductor, conductor, and insulating materials can be used. PMOS as well as NMOS transistors, and depletion-mode as well as enhancement mode transistors, can be fabricated by reversing conductivity types in the description above. Thus, CMOS circuits can be provided. Other materials, for example, germanium and gallium arsenside semiconductor materials are provided for. The insulating material can be formed on a semiconductor substrate or the substrate can be entirely of insulating material. The gate material can be metal instead of semiconductor. These and other modifications to and variations upon the preferred embodiments are provided for by the present invention, the scope of which is limited only by the following claims.

What is claimed is:

1. A transistor structure comprising:
   an insulator layer;
   a semiconductor layer on said insulator layer, said semiconductor layer including
      a source region having throughout a source conductivity type and extending the full thickness of said semiconductor layer, said source region including a heavily doped source section and a lightly doped source section,
      a drain region having throughout said source conductivity type and extending the full thickness of said semiconductor layer, said drain region having a having heavily doped drain section and a lightly doped drain section, and
      a channel region, the thickness of said channel region being less than the thicknesses of said source region and said drain region, said channel region forming respective boundaries with said lightly doped source section and said lightly doped drain section, said channel region being entirely below the bottom level of said heavily doped source region and the bottom level of said heavily doped drain section;
   a gate of conductive material disposed over said channel region, said gate extending at least partially over said source region and said drain region; and
   an insulating layer between said gate and said bannel, source, and drain regions.

2. A transistor structure as recited in claim 1 wherein said channel region is less than half as thick as said source and drain regions.

3. A transistor structure as recited in claim 1 wherein the source/drain dopant concentration profiles are laterally uniform in said source and drain regions, said heavily doped sections lying entirely above said channel region.

4. A transistor structure as recited in claim 1 wherein said heavily doped sections are laterally spaced from said channel region.

* * * * *